Aug. 22, 1967 MASATOSHI MIGITAKA 3,337,378

METHOD FOR THE PRODUCTION OF SEMICONDUCTOR DEVICES

Filed Aug. 26, 1964

INVENTOR.
Masatoshi Migitaka

United States Patent Office 3,337,378

Patented Aug. 22, 1967

3,337,378

METHOD FOR THE PRODUCTION OF SEMICONDUCTOR DEVICES

Masatoshi Migitaka, Tokyo-to, Japan, assignor to Kabushiki Kaisha Hitachi Seisakusho, Tokyo-to, Japan, a joint-stock company of Japan Filed Aug. 26, 1964, Ser. No. 392,217
Claims priority, application Japan, Sept. 6, 1963, 38/46,715
7 Claims. (Cl. 148—177)

This invention relates to semiconductor devices and methods for fabricating the same. More specifically, the invention concerns a new semiconductor device having highly desirable characteristics and a new method for fabricating the same.

Heretofore, the art of forming an intermetallic compound of a group III element and a group V element and, with the use of this intermetallic compound, fabricating a semiconductor device by alloying or alloy diffusion on one surface of a semiconductor element, particularly a semiconductor element consisting of a group IV element, has been known. In this known art, it has been difficult to form an impurity metal having a uniform composition of impurity metal, and some irregularity of composition has occurred in each dot of group III–V intermetallic compounds. Accordingly, in the case when semiconductor devices have been fabricated by alloy diffusion at the same temperature and in the same process time, non-uniform electrical characteristics of the devices have been unavoidable.

Furthermore, in the general case when group III and group V intermetallic compounds are formed, the dot hardness increases, thereby giving rise to frequent inconvenience in handling of the compound. By the conventional method, alloy diffusion is carried out by using this dot. In this case, since the group III element and the group V element are both existing in the melt, the diffusions into the substrate semiconductor of both the group III and group V elements occur simultaneously. Accordingly, it has not been possible to control, separately, the diffusions of the group III and group V elements into the interior of the substrate semiconductor, the only factors for controlling the diffusion of these two impurities having been the diffusion constant and the solubility of each impurity.

It is a general object of the present invention to overcome the difficulties of the prior art as indicated above by relatively simple expedients.

More specifically, it is an object to provide a new method for fabricating semiconductor devices whereby the group III and group V elements can be caused separately to diffuse freely from the melt into the semiconductor substrate.

Briefly stated, the invention is based on the phenomenon whereby a group V element is extremely soluble in a group III element. That is, the invention resides in a method wherein a group V element in vapor state is caused to diffuse into a melt of a group III impurity melted on one surface of a semiconductor substrate, and then, in succession to the group III impurity already diffused in the semiconductor substrate, a group V impurity is caused to diffuse into the substrate semiconductor.

The diffusion phenomenon of this group V impurity can be externally controlled. Therefore, it is also easy by the present invention to form a recrystallized layer of a group III impurity and then to cause a group V impurity to diffuse from the melt into this recrystallized layer. This technique has been impossible by the known art for reasons of a difference in principles.

A melt of a group III element has high solubility with respect to a group V element. Moreover, the diffusion rate of a group V element in a melt of a group III element is 5 to 6 times higher than that into a solid, being approximately $10^{-6}$ cm.$^2$/sec.

The nature, utility, and details of the invention will be more clearly apparent by reference to the following description with respect to specific embodiments of the invention, when taken in conjunction with the accompanying drawing in which.

Figure 1:
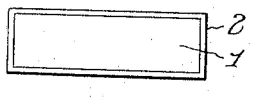
FIGURES 1 and 2 are enlarged sectional views showing the essential parts of an embodiment of the invention in different stages of fabrication.

Referring to FIGURE 1, the surfaces of an n-type silicon element 1 of 50-ohm cm. resistivity and dimensions of 1 mm. x 1 mm. x 0.5 mm. were coated with a nickel plating layer 2 of approximately 1-micron thickness in a solution containing sodium hypophosphite. Next, the nickel plating layer deposited on one surface 3 of the silicon element 1 was removed by chemical etching. Then, on one part of the said surface, an indium dot was placed, and alloying was carried out on the device in a jig for 5 minutes in a hydrogen atmosphere at 1,200 deg. C. As a result of this treatment, an excellent ohmic contact was obtained.

Figure 2:
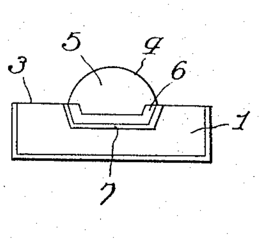

The semiconductor device so fabricated is shown in enlarged sectional view in FIGURE 2, in which reference numeral 5 designates an indium region containing silicon, and 6 designates a silicon recrystallized layer of n-type conductivity below the region 5. Below the layer 6 there is formed an indium diffusion layer 7, which has been rendered into one of n-type by a later phosphorus diffusion.

In the above described example of treatment, the recrystallized layer obtained by alloying the silicon containing indium becomes one of n-type conductivity as fully explained in a copending patent application (U.S. Ser. No. 312,739 filed on Sept. 30, 1963, now Patent No. 3,285,991). However, in the case where the resistivity of the substrate is high, indium diffuses at the interface betwen the recrystallized layer and the substrate semiconductor from the recrystallized layer side into the substrate semiconductor, and a thin p-type layer is formed in the close vicinity of the interface.

On the other hand, however, the phosphorus contained in the nickel plating emerges in a gaseous state into the surrounding atmosphere and dissolves into the indium melt. Consequently, diffusion of the phosphorus from the melt occurs to overcome the p-type conductivity of the aforesaid thin p-type layer, which is thereby rendered into a thin n-type layer.

Figure 3:
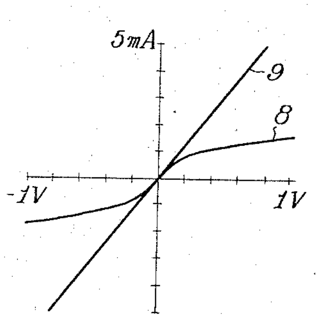
FIGURE 3 is a graphical representation indicating current-voltage characteristics of a device of this invention and of a conventional device.

As a result, the electrode obtained as described in the above example has low contact resistance and is an excellent ohmic contact. The effect of phosphorus is indicated by comparative characteristic curves in FIGURE 3, in which curve 8 indicates the current-voltage curve in the case of alloying indium with silicon without phosphorus diffusion, and curve 9 indicates that in the case of the present invention wherein phosphorus diffusion is utilized. As is observable from these experimental results, the present invention affords excellent ohmic contact.

The utility of the present invention can be further observed from the following description of an embodiment of the invention as applied to the fabrication of an npn transistor element.

Figure 4:
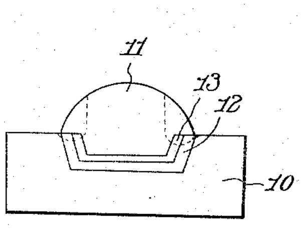
FIGURE 4 is an enlarged sectional view showing the essential parts of another embodiment of the invention.

Referring to FIGURE 4, on one surface of a germanium element 10 of 1-ohm cm. resistivity, an indium dot 11 is heated at 900 deg. C. in a hydrogen atmosphere and thereafter slowly cooled to 800 deg. C. at a rate of 20 deg. C./min., whereupon a p-type germanium recrystallized layer 12 is formed. At this time, the region designated by reference numeral 11 is in a molten state.

Next, the hydrogen atmosphere is replaced by a gas mixture of nitrogen and phosphorus vapor introduced for approximately 20 minutes around the germanium workpiece. During this time, the phosphorus in the gas mixture immediately dissolves into the indium melt and diffuses into the above mentioned germanium recrystallized layer to form an n-type diffusion layer 13. Then, the introduction of the nitrogen-phosphorus gas mixture is stopped, and the workpiece is cooled.

The germanium device obtained by the above described process is then chemically etched as indicated by dotted lines in FIGURE 4 so that the indium metal layer 11 containing germanium and the germanium recrystallized layer 12 will not be in a directly connected state.

As a result of the above described fabrication procedure, an npn germanium transistor element is obtained.

From the above description with respect to two embodiments of the invention, it will be apparent that, by the practice of the present invention, it is possible to cause group III and group V elements to diffuse separately and freely from a melt into a semiconductor substrate. That is, the present invention has the highly desirable advantage of making possible the control of the time instant at which the group V element is introduced and temperature of the impurity (group V element) gas in addition to the control of the difference between the solubilities of the group III and group V elements and the difference between their diffusion constants.

It should be understood, of course, that the foregoing disclosure relates to only particular embodiments of the invention and that it is intended to cover all changes and modifications of the examples of the invention herein chosen for the purposes of the disclosure, which do not constitute departures from the spirit and scope of the invention as set forth in the appended claims.

I claim:

1. A process for the production of semiconductor devices which comprises coating a selected part of a semiconductor substrate with a fine layer of nickel containing a group V element; alloying another part of said substrate with a molten group III element; said group V element, during alloying, entering said group III element and causing diffusion into said substrate.

2. The process as defined in claim 1, wherein said semiconductor substrate is silicon.

3. The process as defined in claim 1, wherein said semiconductor substrate is germanium.

4. The process as defined in claim 1, wherein said group III element is indium.

5. The process as defined in claim 1, wherein said group V element initially is present as a compound and decomposes during the process, thus entering said substrate as a gas evolved in situ.

6. The process as defined in claim 5, wherein said compound is sodium hypophosphite.

7. A process for the production of semiconductor devices which comprises coating a semiconductor substrate, selected from the group consisting of silicon and germanium, with a fine layer of nickel in a solution containing sodium hypophosphite; removing the coating thus obtained from a part of said substrate; alloying said part with indium; said sodium hypophosphite, during alloying, decomposing and yielding phosphorus which enters into said indium, causing the latter to diffuse into said substrate.

References Cited

UNITED STATES PATENTS

| | | | |
|---|---|---|---|
| 2,974,072 | 3/1961 | Genser | 148—180 |
| 3,010,855 | 11/1961 | Barson et al. | 148—180 |

DAVID L. RECK, *Primary Examiner.*

R. O. DEAN, *Assistant Examiner.*